(12) United States Patent
Amano et al.

(10) Patent No.: US 10,205,859 B2
(45) Date of Patent: Feb. 12, 2019

(54) MOUNTING DEVICE, IMAGE PROCESSING METHOD, AND IMAGING UNIT

(71) Applicant: FUJI CORPORATION, Chiryu-shi (JP)

(72) Inventors: Masafumi Amano, Okazaki (JP); Kazuya Kotani, Toyota (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/741,599

(22) PCT Filed: Jul. 6, 2015

(86) PCT No.: PCT/JP2015/069427
§ 371 (c)(1),
(2) Date: Jan. 3, 2018

(87) PCT Pub. No.: WO2017/006416
PCT Pub. Date: Jan. 12, 2017

(65) Prior Publication Data
US 2018/0205855 A1    Jul. 19, 2018

(51) Int. Cl.
*H04N 9/47* (2006.01)
*H04N 7/18* (2006.01)
(Continued)

(52) U.S. Cl.
CPC ......... *H04N 5/2253* (2013.01); *G06T 3/4069* (2013.01); *H04N 5/2254* (2013.01);
(Continued)

(58) Field of Classification Search
CPC .... H04N 5/232; H04N 5/2253; H04N 5/2254; H04N 5/23238; H05K 13/0404;
(Continued)

(56) References Cited

U.S. PATENT DOCUMENTS 8,654,205 B2    2/2014   Ito
9,936,620 B2*   4/2018   Mori ................. H05K 13/0417
(Continued)

FOREIGN PATENT DOCUMENTS

JP    11-191157 A    7/1999
JP    2000-180119 A  6/2000
(Continued)

OTHER PUBLICATIONS

Extended European Search Report dated Jun. 11, 2018 in European Patent Application No. 15897679.5, 10 pages.
(Continued)

*Primary Examiner* — Ngoc Yen T Vu
(74) *Attorney, Agent, or Firm* — Oblon, McClelland, Maier & Neustadt, L.L.P.

(57) ABSTRACT

Mounting device 11 captures an image of reference mark 25 at a first position at which mounting head 22 is stopped under first imaging conditions, and captures an image of component 60 under second imaging conditions. Then, mounting device 11 moves mounting head 22 and captures an image of reference mark 25 at a second position at which mounting head 22 is stopped under the first imaging conditions, and captures a second image of component 60 under the second imaging conditions. Further, mounting device 11 generates an image of component 60 picked up by mounting head 22 based on the positional relationship of reference mark 25 using the first image and the second image.

8 Claims, 9 Drawing Sheets

(51) Int. Cl.
*H04N 5/225* (2006.01)
*H04N 5/232* (2006.01)
*H05K 13/08* (2006.01)
*G06T 3/40* (2006.01)
*H05K 13/04* (2006.01)

(52) U.S. Cl.
CPC ......... *H04N 5/232* (2013.01); *H04N 5/23238* (2013.01); *H05K 13/0404* (2013.01); *H05K 13/0413* (2013.01); *H05K 13/08* (2013.01); *H05K 13/081* (2018.08); *H05K 13/0812* (2018.08)

(58) Field of Classification Search
CPC .............. H05K 13/0413; H05K 13/081; H05K 13/0812; H05K 13/08; G06T 3/4069

See application file for complete search history.

(56) References Cited

U.S. PATENT DOCUMENTS

| | | | |
|---|---|---|---|
| 2009/0092288 | A1* | 4/2009 | Uemura .............. G03F 7/70791 382/106 |
| 2009/0226846 | A1* | 9/2009 | Nakano .............. G03F 7/70341 430/311 |
| 2016/0150689 | A1 | 5/2016 | Amano et al. |
| 2016/0309630 | A1 | 10/2016 | Amano et al. |
| 2018/0068158 | A1* | 3/2018 | Hiroi ......................... G06T 7/60 |

FOREIGN PATENT DOCUMENTS

| | | |
|---|---|---|
| JP | 2012-3469 A | 1/2012 |
| JP | 2013-21196 A | 1/2013 |
| WO | WO 2015/004717 A1 | 1/2015 |
| WO | WO2015/083220 A1 | 6/2015 |

OTHER PUBLICATIONS

International Search Report dated Sep. 29, 2015, in PCT/JP2015/069427 filed Jul. 6, 2015.

* cited by examiner

FIG. 7
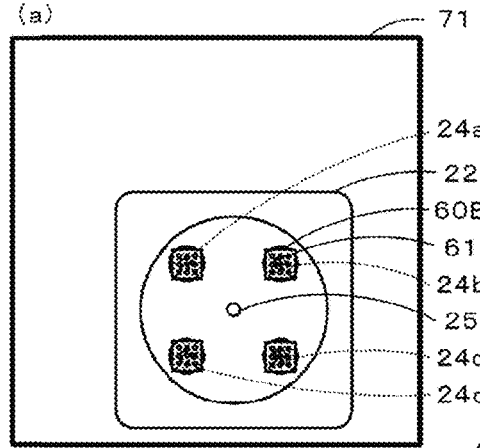
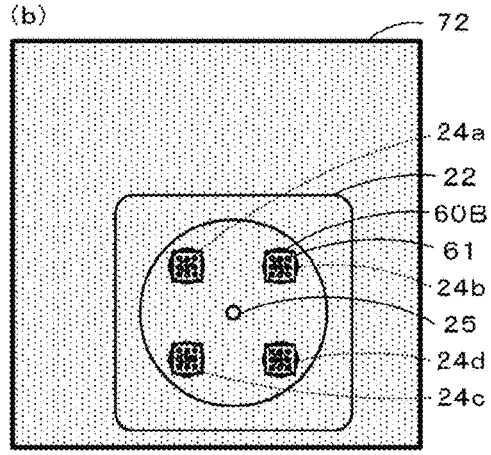
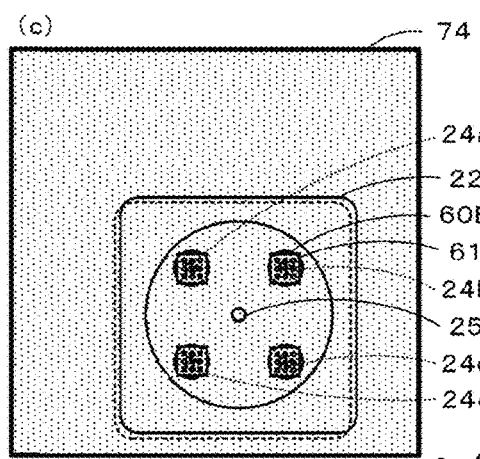
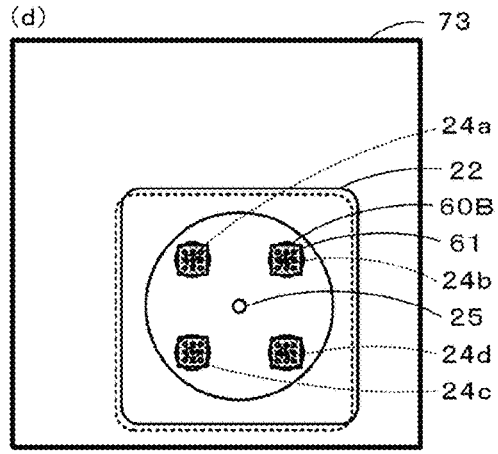

FIG. 9
(a)
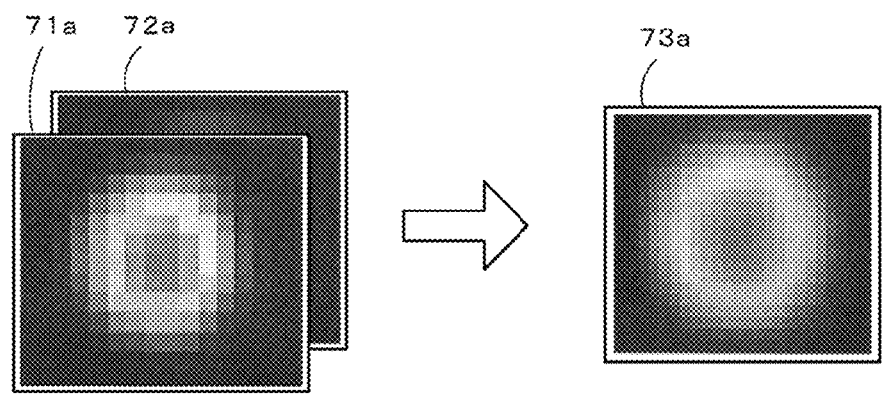
(b)
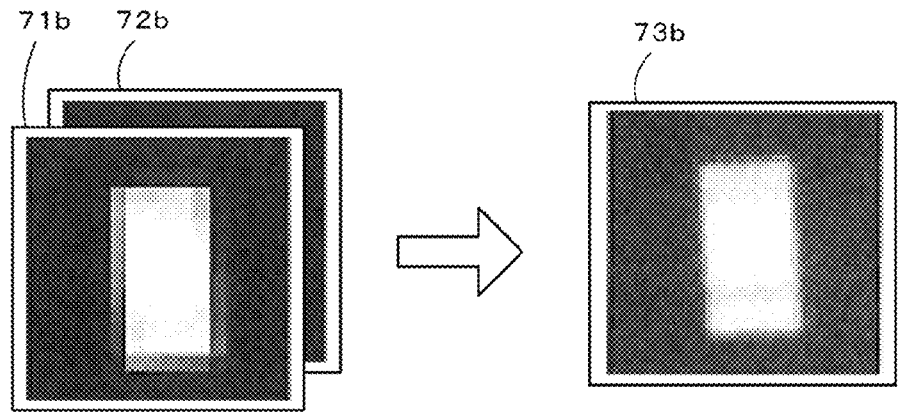

MOUNTING DEVICE, IMAGE PROCESSING METHOD, AND IMAGING UNIT

TECHNICAL FIELD

The present invention relates to a mounting device, an image processing method, and an imaging unit.

BACKGROUND ART

Conventionally, as an image processing method, a method of acquiring multiple images including a position deviation, aligning the multiple images, and generating an interpolated image by interpolation processing based on the multiple images has been suggested (for example, refer to patent literature 1). With this method, an image is selected that is used in generation of a composite image by an optimization process in which positioning precision is weighted.

CITATION LIST

Patent Literature

Patent literature 1: JP-A-2012-003469

SUMMARY OF INVENTION

Technical Problem

A mounting device provided with a mounting head that collects components, and that mounts the components on a board using the mounting head is given as an example of a device that adopts such an image processing method. With such a mounting device, to grasp the shape and position of a component, there are cases in which images of a higher resolution are required. With the mounting device, to perform mounting processing of components of various sizes, shapes, and colors, there are cases in which imaging conditions are changed in accordance with the component. Also, as in the above patent literature 1, one may consider generating a high resolution image using multiple images, but it is necessary to perform accurate alignment of the multiple images. Thus, for such a mounting device, it is desirable to more reliably achieve images with a higher resolution.

The present invention takes account of such circumstances, and an object thereof is to provide a mounting device, an image processing method, and an imaging unit that enable more reliable achievement of a higher resolution image.

Solution to Problem

The present invention uses the following means to achieve the above object.

A mounting device of the present invention includes:
a mounting head including a reference mark and a pickup member for picking up a component, the mounting head being configured to move a picked up component above a board;
an imaging section configured to capture an image; and
a control section configured to capture an image of the reference mark under first imaging conditions at a first position at which the mounting head is stopped within an imaging range of the imaging section, capture a first image that includes the component picked up by the pickup member under second imaging conditions that are different from the first imaging conditions, and then move the mounting head and capture an image of the reference mark under the first imaging conditions at a second position at which the mounting head is stopped within the imaging range, capture a second image that includes the component picked up by the pickup member under the second imaging conditions, and generate an image of the component picked up by the mounting head based on a positional relationship of the reference mark using the first image and the second image.

With this device, an image of a reference mark is captured at a first position at which the mounting head is stopped under first imaging conditions, and a first image including a component is captured under second imaging conditions. Then, the device moves the mounting head and captures an image of the reference mark at a second position at which the mounting head is stopped under the first imaging conditions, and captures a second image including the component under the second imaging conditions. Further, the device generates an image of the component picked up by the mounting head based on the positional relationship of the reference marks using the first image and the second image. With this device, even if optimal imaging conditions are different for the reference mark and the component, by capturing images under appropriate respective conditions, it is possible to achieve a better image. Also, with the device, it is possible to obtain a relative position of the component from the respective images of the reference mark, and it is possible to generate a higher resolution image using the multiple images. Therefore, with the device, it is possible to more reliably achieve a higher resolution image.

In a mounting device of the present invention, the imaging conditions may be at least one of a lighting position of illumination, a color of illumination, an exposure time, or a focal length. With this device, by changing either of a lighting position of illumination, a color of illumination, an exposure time, or a focal length for the reference mark and the component, it is possible to obtain a better image of each.

In a mounting device of the present invention, the control section, at the first position and the second position, may image the reference mark and then image the component. With this device, because the reference mark is imaged first as a reference position, it is easier to perform image processing such as positional identification of the component or the like.

Alternatively, in a mounting device of the present invention, the control section, after imaging at the first position under the first imaging conditions, may move the mounting head and capture an image under the first imaging conditions at the second position first, or, after imaging at the first position under the second imaging conditions, may move the mounting head and capture an image at the under the second imaging conditions at the second position first. With this device, because imaging is performed under the same imaging conditions before and after movement of the mounting head, for example, in a case in which time is required for processing to change the imaging conditions, because the frequency of changing the imaging conditions can be curtailed, the time required for processing overall can be reduced.

In a mounting device of the present invention, the control section, using the first image and the second image having a first resolution captured by the imaging section, may generate an image of a second resolution that has a higher resolution than the first resolution. With this device, because a higher resolution image is obtained, it is possible to more accurately determine the position and shape of a component.

With this device, the control section may generate the image having the second resolution by performing multiframe high resolution processing.

In a mounting device of the present invention, the control section, when it is possible to capture the reference mark and the component under the same conditions, may image the reference mark and the component together under the same imaging conditions. With this device, for a component for which the imaging conditions do not have to be changed for the reference mark and the component, by capturing an image of the reference mark and the component under the same imaging conditions, the time required for processing can be reduced.

An image processing method of the present invention is for a mounting device provided with a mounting head including a reference mark and a pickup member for picking up a component, the mounting head being configured to move a picked up component above a board, and an imaging section for capturing images, the image processing method including:

capturing an image of the reference mark under first imaging conditions at a first position at which the mounting head is stopped within an imaging range of the imaging section, capturing a first image that includes the component picked up by the pickup member under second imaging conditions that are different from the first imaging conditions, and then moving the mounting head and capturing an image of the reference mark under the first imaging conditions at a second position at which the mounting head is stopped within the imaging range, capturing a second image that includes the component picked up by the pickup member under the second imaging conditions, and generating an image of the component picked up by the mounting head based on a positional relationship of the reference mark using the first image and the second image.

With this image processing method, similar to the above mounting device, it is possible to more reliably achieve a higher resolution image. Note that, with the imaging processing method, various aspects of the mounting device described above may be adopted, or a step for realizing each function of the mounting device described above may be added.

An imaging unit of the present invention is for a mounting device provided with a mounting head including a reference mark and a pickup member for picking up a component, the mounting head being configured to move a picked up component above a board, and an imaging section for capturing images, the imaging unit including:

an imaging section configured to capture an image; and a control section configured to capture an image of the reference mark under first imaging conditions at a first position at which the mounting head is stopped within an imaging range of the imaging section, capture a first image that includes the component picked up by the pickup member under second imaging conditions that are different from the first imaging conditions, and then move the mounting head and capturing an image of the reference mark under the first imaging conditions at a second position at which the mounting head is stopped within the imaging range, capture a second image that includes the component picked up by the pickup member under the second imaging conditions, and generate an image of the component picked up by the mounting head based on a positional relationship of the reference mark using the first image and the second image.

With this imaging unit, similar to the above mounting device, it is possible to more reliably achieve a higher resolution image. Note that, with the imaging unit, various aspects of the mounting device described above may be adopted, or a step for realizing each function of the mounting device described above may be added.

BRIEF DESCRIPTION OF DRAWINGS

FIG. 7 is for illustrating image 71 to image 74.

FIG. 9 illustrates generation of high resolution images 73a and 73b.

DESCRIPTION OF EMBODIMENTS

Figure 1:
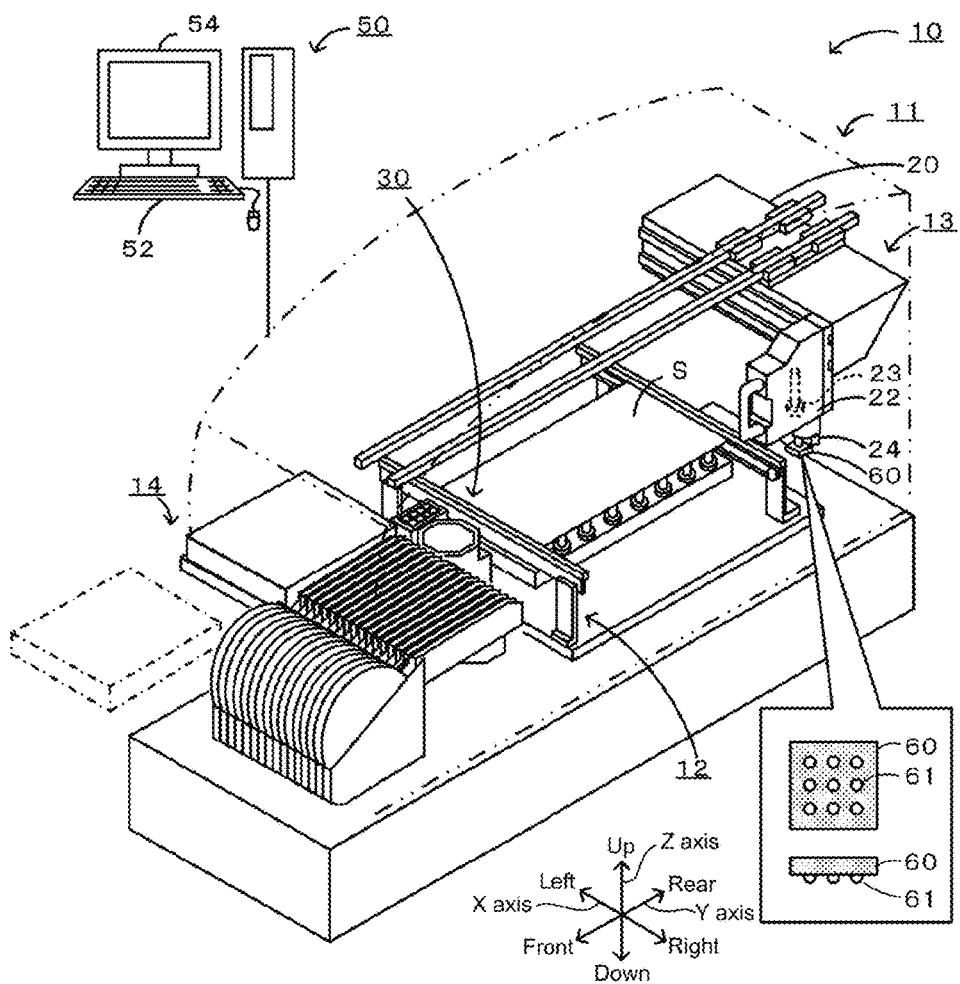
FIG. 1 is a schematic view showing an example of mounting system 10.
Figure 2:
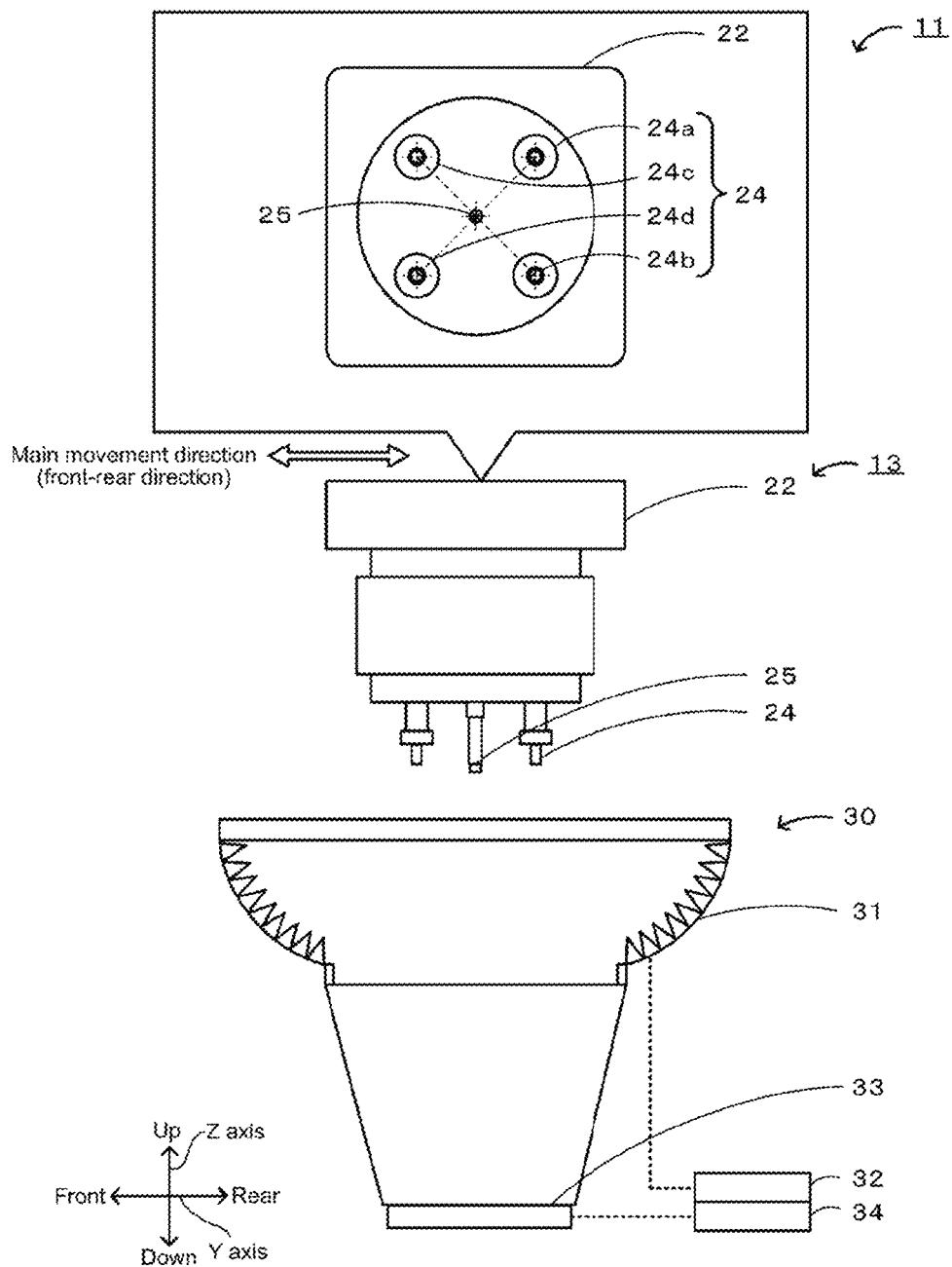
FIG. 2 shows mounting head 22 and imaging unit 30.
Figure 3:
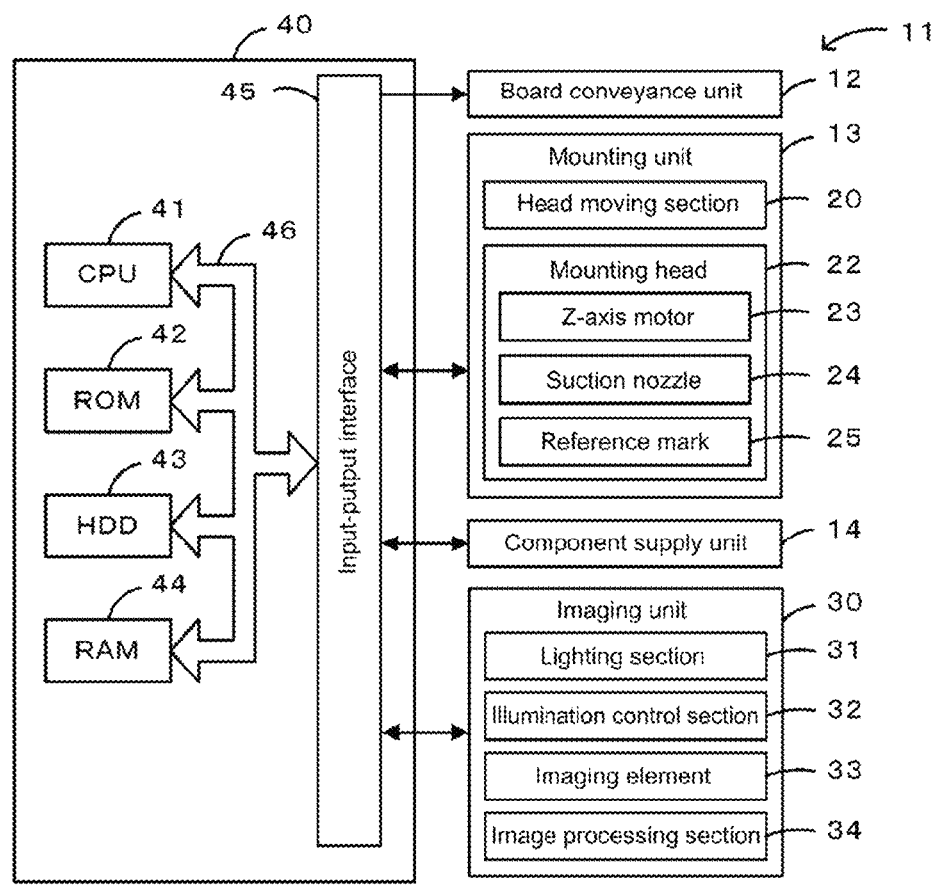
FIG. 3 is a block diagram showing the configuration of mounting device 11.

Hereinafter, an embodiment of the present invention will be described with reference to the figures. FIG. 1 is a schematic view showing an example of mounting system 10. FIG. 2 shows mounting head 22 and imaging unit 30. FIG. 3 is a block diagram showing the configuration of mounting device 11. Mounting system 10, for example, mounts components 60 on board S. Mounting system 10 is provided with mounting device 11 and management computer (PC) 50. Multiple mounting devices 11 that perform mounting processing of mounting components on board S are arranged from upstream to downstream in mounting system 10. For ease of understanding, FIG. 1 only shows one mounting device 11. Mounting processing includes processing such as arranging a component above a board, mounting, insertion, joining, and gluing. In the present embodiment, left-right directions (X axis), front-rear directions (Y axis), and up-down directions (Z axis) are set as shown in FIGS. 1 and 2.

As shown in FIGS. 1 to 3, mounting device 11 is provided with board conveyance unit 12, mounting unit 13, component supply unit 14, imaging unit 30, and control device 40. Board conveyance unit 12 loads board S, conveys board S, fixes board S at a mounting position, and unloads board S. Board conveyance unit 12 includes a pair of conveyor belts provided extending in a left-right direction and separated in the front-rear direction of FIG. 1. Board S is conveyed by these conveyor belts.

Mounting unit 13 picks up component 60 from component supply unit 14 and mounts the component 60 on board S fixed by board conveyance unit 12. As shown in FIG. 1, component 60, for example, is a BGA component provided with a grid of many bumps 61 as electrodes on a lower section of a plate-shaped main body. Mounting unit 13 is provided with head moving section 20, mounting head 22, and suction nozzle 24. Head moving section 20 is provided with sliders that move in XY directions guided by guide rails and motors that drive the sliders. Mounting head 22 is removably attached to a slider and is movable in the XY directions by head moving section 20. At least one suction nozzle 24 is removably attached to an underside of mounting head 22. Here, descriptions are given mainly for a case in which four nozzles, suction nozzles 24a to 24d, are attached to mounting head 22 (see FIG. 2). Also, suction nozzles 24a to 24d are collectively referred to as suction nozzles 24. Suction nozzle 24 uses negative pressure to pick up component 60, and is removably attached to mounting head 22. Mounting head 22 is equipped with in-built Z-axis motor 23 and the height of suction nozzle 24 is adjusted along the Z axis by the Z-axis motor. Also, mounting head 22 is provided with a rotation device that uses a drive motor, not shown, to rotate (on its own axis) suction nozzle 24, such that the angle of the component picked up by suction nozzle 24 can be adjusted.

As shown in FIG. 2, reference mark 25 that is a reference position for a picked up component is arranged on a bottom surface of mounting head 22. Reference mark 25 is arranged on mounting head 22 in a central section that is surrounded by suction nozzles 24. Note that, reference mark 25 may be provided on an outside circumference of mounting head 22, at an edge of the imaging range of imaging unit 30. Reference mark 25 is provided with a support and a circular disk-shaped mark member arranged at an end of the support. Mark 25 is arranged with a specified positional relationship with suction nozzles 24, for example, at a specified distance. Because suction nozzles 24a to 24d have a specified positional relationship (distance and arrangement position) with reference mark 25, if the position of reference mark 25 can be recognized, the position of each of the suction nozzles 24 can be recognized.

Component supply unit 14 is provided with multiple reels, and is removably attached to a front side of mounting device 11. Tape is wound on each reel and multiple components are held in the surface of the tape in a lengthwise direction. The tape is unwound to the rear from the reel, and with a component exposed, is fed by a feeder section to a pickup position at which the component is picked up by suction nozzle 24. Component supply unit 14 is provided with a tray unit that includes a tray on which components are loaded in multiple rows. The tray unit is provided with a moving mechanism that moves the tray to a specified pickup position by pulling out the tray, which is fixed to a pallet, from a magazine cassette, which is not shown. Many rectangular cavities are formed in the tray, and components are housed in the cavities. Components housed in trays are often components that are taller than those housed in reels. Components 60 are stored in a tray of the tray unit.

Imaging unit 30 captures an image of a component held by mounting head 22 and reference mark 25 provided on mounting head 22. Imaging unit 30 is arranged between component supply unit 14 and board conveyance unit 12. The imaging range of imaging unit 30 is above imaging unit 30. Imaging unit 30 is provided with lighting section 31, illumination control section 32, imaging element 33, and image processing section 34. Lighting section 31 is configured to emit light upward and in multiple lighting states with respect to component 60 held by mounting head 22. Lighting section 31, for example, includes lamps arranged at upper, middle, and lower layers, and incident lamps that are not shown, as light sources, and is a light source unit capable of adjusting the light beam position, the light wavelength, the brightness (light amount), and so on of light emitted to the component held by suction nozzle 24. With lighting section 31, when the upper level lamps are turned on, light is shone from the sides, when the lower level lamps are turned on, light is shone from the sides and below, when the incident lamps are turned on, light is shone from below, and when all the lamps are turned on, light is shone such that the entire area is brighter. Illumination control section 32 controls lighting section 31 such that the lighting state is adjusted in accordance with the component held by suction nozzle 24 based on specified lighting conditions. Imaging element 33 emits an electric charge when receiving light, and outputs the electric charge. Imaging element 33 may be a CMOS image sensor capable of high-speed continuous acquisition by overlapping a post-exposure electric charge transfer process and a subsequent image exposure process. Image processing section 34 performs processing to generate image data based on inputted electric charges. Imaging unit 30, when suction nozzle 24 holding a component passes above imaging unit 30, captures at least one image while mounting head 22 is moving or with mounted head 22 in a stopped state and outputs captured image data to control device 40.

As shown in FIG. 3, control device 40 is configured from a microprocessor based around CPU 41, ROM 42 that memorizes a processing program, HDD 43 that memorizes various data, RAM 44 used as working memory, input-output interface 45 for performing communication of electric signals with external devices, and so on, and these are connected by bus 46. Control device 40 outputs control signals to board conveyance unit 12, mounting unit 13, component supply unit 14, and imaging unit 30, and receives signals from mounting unit 13, component supply unit 14, and imaging unit 30.

Management PC 50 manages information of each device of mounting system 10. Management PC 50 is provided with input device 52 such as a keyboard and mouse for an operator to input various commands, and display 54 for displaying various information.

Figure 4:
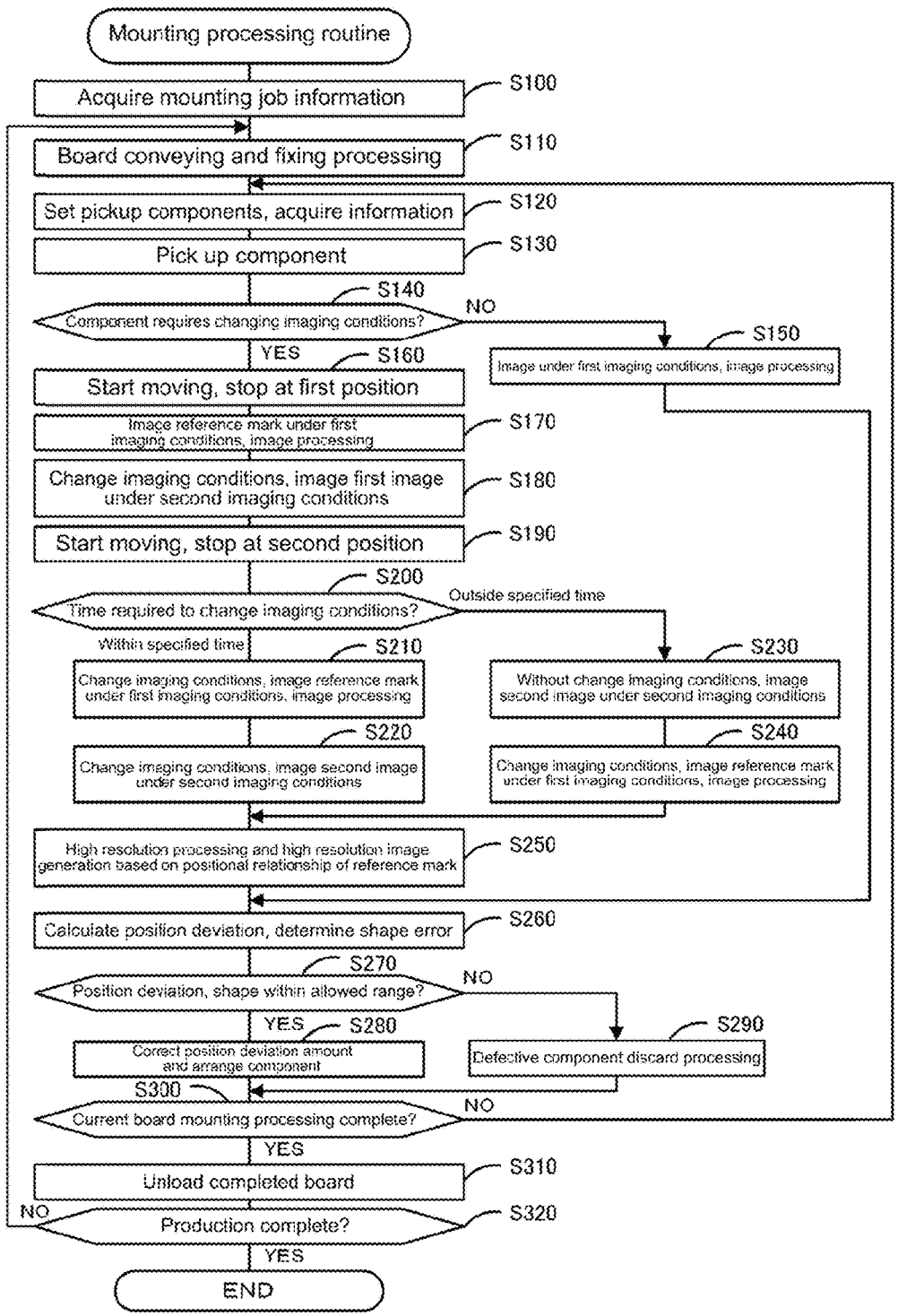
FIG. 4 is a flowchart showing an example of a mounting processing routine.
Figure 5:
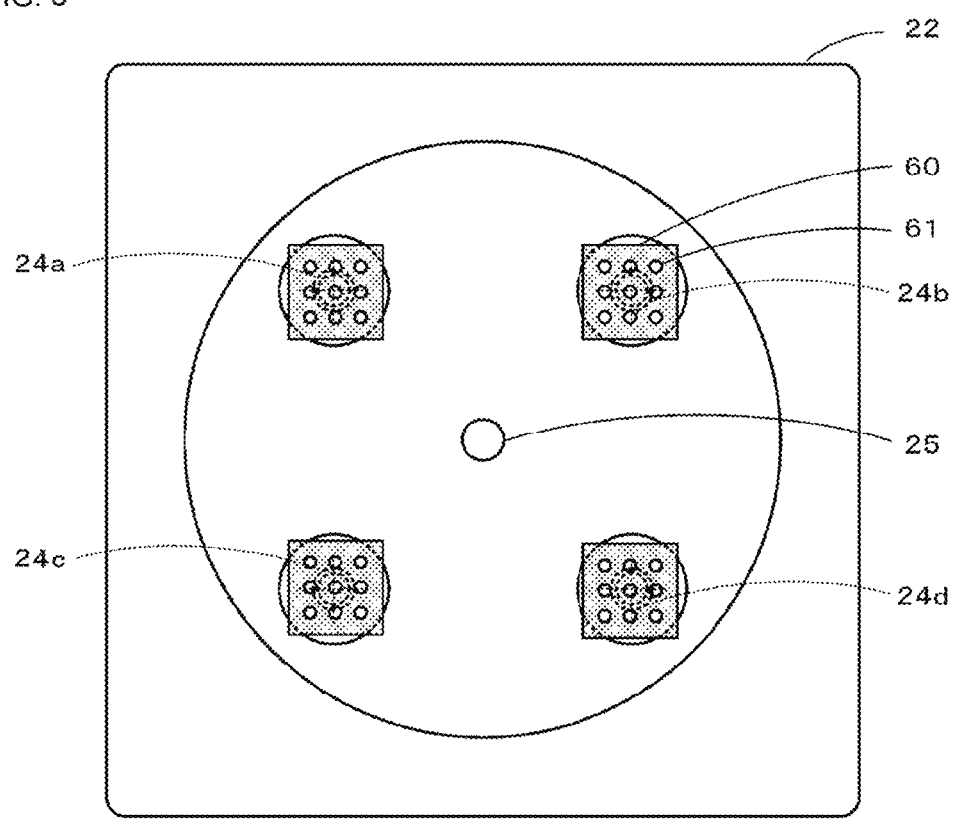
FIG. 5 shows mounting head 22 that has picked up component 60.

Next, operation of mounting system 10 of the present embodiment as configured above is described, specifically, mounting processing of mounting device 11. FIG. 4 is a flowchart showing an example of a mounting processing routine performed by CPU 41 of control device 40. This routine is memorized on HDD 43 of control device 40 and is performed based on a start command from an operator. Here, as shown in FIG. 5, descriptions are mainly given for a case in which all suction nozzles 24a to 24d pick up a component 60 and mount the component 60 on board S. FIG. 5 shows mounting head 22 that has picked up component 60. When the routine is started, first, CPU 41 of control device 40 acquires mounting job information from management computer 50 (step S100). Included in mounting job information are the mounting order of components, the types and characteristics of components to be mounted, information related to suction nozzles 24 used to pick up components, imaging conditions for imaging unit 30 (including illumination conditions), and the like. Included in component characteristics are information of the size of components, reference images that are images of components with correct shapes, and the like.

Next, CPU 41 performs a process of conveying and fixing board S (step S110), sets components to be picked up, and acquires that information from the mounting job information (step S120). Then, CPU 41 causes the necessary suction nozzles 24 to be attached to mounting head 22, and performs pickup processing for the set components (step S130). In pickup processing, CPU 41 performs processing to move mounting head 22 to the pickup positions of component supply unit 14 in which the relevant components are stored, lower suction nozzles 24, and pick up the components using suction nozzles 24. During this pickup processing, one or more components 60 may be picked up by suction nozzles 24a to 24d.

Next, CPU 41 determines whether it is necessary to change the imaging conditions for the component (step S140). This determination is performed based on component information included in the mounting job information. Components used in mounting device 11 have many different optical characteristics (for example, surface brightness, light reflectance rate, and so on), and different arrangements and shapes of electrodes, such that different imaging conditions of exposure time and illumination used need to be changed. In this case, there are cases in which reference mark 25 that is a reference position of the component cannot be imaged clearly depending on the imaging conditions. Also, components used in mounting device 11 have various sizes, and when an imaging unit 30 with a field of view capable of imaging large component is provided, there are cases in which the resolution is not high enough for small components. With mounting device 11, when this type of small component is imaged, a high resolution image is obtained by deciding the positioning based on reference mark 25 using multiple low resolution images. In step S140, it is determined whether a component picked up by mounting head 22 requires a high resolution image and whether the lighting conditions are different for reference mark 25 and the component. Note that, for component 60, because the appropriate incident angle of illumination is different for bumps 61 and reference mark 25, the imaging conditions are different to normal. Also, because for determining whether component 60 is normal, detection is performed for damage or deformation of the relatively small bumps 61, a high resolution image is desired. Thus, a positive determination is made for component 60 in step S140.

In step S140, when there are no components picked up for which it is necessary to change imaging conditions, CPU 41 uses imaging unit 30 to capture an image of mounting head 22 under specified first imaging conditions, and performs processing on the captured image (step S150). Here, CPU 41 captures an image of mounting head 22 using imaging unit 30 while mounting head 22 is moving. Accordingly, compared to a case in which mounting head 22 is stopped, the time required for imaging is shorter. These first imaging conditions may be, for example, conditions that allow reference mark 25 to be captured sufficiently clearly. Also, reference marks 25 may have optical characteristics such that as many components as possible can be imaged together. CPU 41 uses the captured image to determine position deviation and any shape errors with respect to the component picked up by mounting head 22 (step S260).

On the other hand, in step S140, if there is a picked up component (component 60) for which the imaging conditions need to be changed, CPU 41 moves mounting head 22 towards a first position set inside the imaging range of imaging unit 30, and then, when mounting head 22 reaches the first position, stops movement of mounting head 22 (step 160). When movement of mounting head 22 starts, CPU 41, using the first imaging conditions as imaging conditions for imaging unit 30, uses imaging unit 30 to capture an image of reference mark 25 after mounting head 22 has stopped at the first position, and starts image processing of the captured image (step S170). Image processing, for example, is processing to determine the position of reference mark 25 in the image. Next, CPU 41, with mounting head 22 stopped at the first position, changes the imaging conditions to the second imaging conditions for capturing component 60, and captures a first image including component 60 under the second imaging conditions (step S180). The imaging conditions may include, for example, at least one of a lighting position, a color of illumination, an exposure time, or a focal length of lighting section 31. In this manner, CPU 41 captures an image of reference mark 25 and an image of component 60 at the same first position under different imaging conditions.

Next, CPU 41 moves mounting head 22 to a second position that is different to the first position and is set within the imaging range of imaging unit 30, and then, when mounting head 22 reaches the second position, stops movement of mounting head 22 (step S190). The second position may be set at a position where the second image can be captured and may be shifted 1/X pixels (where X>1, for example, X=2) with respect to the first position at which the first image was captured such that multi-frame super-resolution processing can be performed. When movement of mounting head 22 is started, CPU 41 determines whether the time required to change the imaging conditions is within a specified time (step S200). The specified time, for example, may be defined by the time required to move from the first position to the second position, or may be defined based on the movement time. For example, if the time required to change the imaging conditions is shorter than the movement time, imaging processing can be started immediately after movement. On the other hand, if the time required to change the imaging conditions is longer than the movement time, image processing cannot be started immediately after movement. The determination of step S200 is for determining whether to change to the post-movement imaging conditions from the pre-movement imaging conditions considering shortening the processing time.

Figure 6:
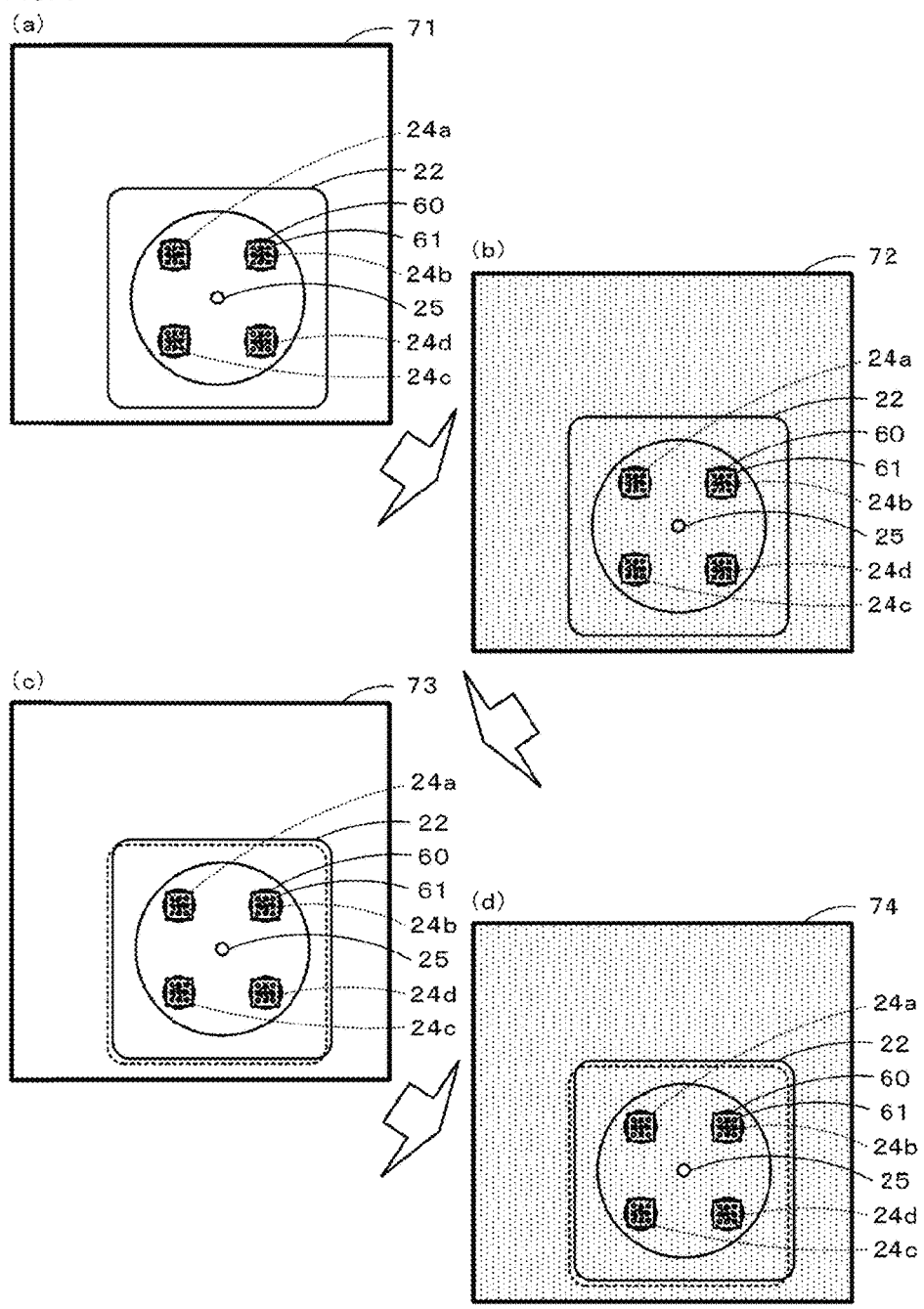
FIG. 6 is for illustrating image 71 to image 74.

When the time required for changing the imaging conditions is within the specified time, CPU 41 changes imaging conditions, uses imaging unit 30 to capture an image of reference mark 25 under the first imaging conditions, and similar to step S170, starts image processing of the captured image (step S210). Next, CPU 41, with mounting head 22 stopped at the second position, changes the imaging conditions to the second imaging conditions for capturing component 60, and captures a second image including component 60 under the second imaging conditions (step S220). Capturing an image of reference mark 25 before capturing an image of component 60 is desirable due to the efficiency of shortening processing time and so on because the positioning of the first image and the second image is performed based on the position of reference mark 25. FIG. 6 shows image 71 to image 74; FIG. 6(*a*) is image 71 of reference mark 25 captured at the first position; FIG. 6(*b*) is image 72 of component 60 captured at the first position; FIG. 6(*c*) is image 73 of reference mark 25 captured at the second position; and FIG. 6(*d*) is image 74 of component 60 captured at the second position. With component 60, to obtain an image in which portions other than bumps 61 do not appear, imaging conditions are set such that the upper level lamps of lighting section 31 are turned on so that light is shone from the sides. With reference mark 25, imaging conditions are set such that all the lamps of lighting section 31 are turned on so that light is shone from all directions. CPU 41 is able to determine the relative positions of reference mark 25 and component 60 at the first position using image 71 of reference mark 25 and image 72 of component 60 captured at the same first position under appropriate imaging conditions. Similarly, the relative positions of reference mark 25 and component 60 at the second position can be determined using images 73 and 74.

On the other hand, in step S200, when the time required to change the imaging conditions is longer than the specified time, CPU 41 uses imaging unit 30 to capture a second image of component 60 under the second imaging conditions for capturing component 60 without changing the imaging conditions (step S230). Next, CPU 41, with mounting head 22 stopped at the second position, changing the imaging conditions to the first imaging conditions for capturing an image of reference mark 25, and uses imaging unit 30 to capture an image of reference mark 25 under the first imaging conditions, and then, similarly to step S170, starts image processing of the captured image (step S240). FIG. 7 shows image 71 to image 74; FIG. 7(a) is image 71 of reference mark 25 captured at the first position; FIG. 7(b) is image 72 of component 60B captured at the first position; FIG. 7(c) is image 74 of component 60B captured at the second position; and FIG. 7(d) is image 73 of reference mark 25 captured at the second position. Component 60B requires more time to change the imaging conditions. In this case, CPU 41, after moving mounting head 22 to the second position, captures an image at the second position without changing the imaging conditions. Compared to changing the imaging conditions three times as in FIG. 6, in this case, because the imaging conditions are only changed twice, time efficiency is improved. In this manner, CPU 41 captures an appropriate image of reference mark 25 and an appropriate image of component 60 at the first position, and captures an appropriate image of reference mark 25 and an appropriate image of component 60 at the second position.

Figure 8:
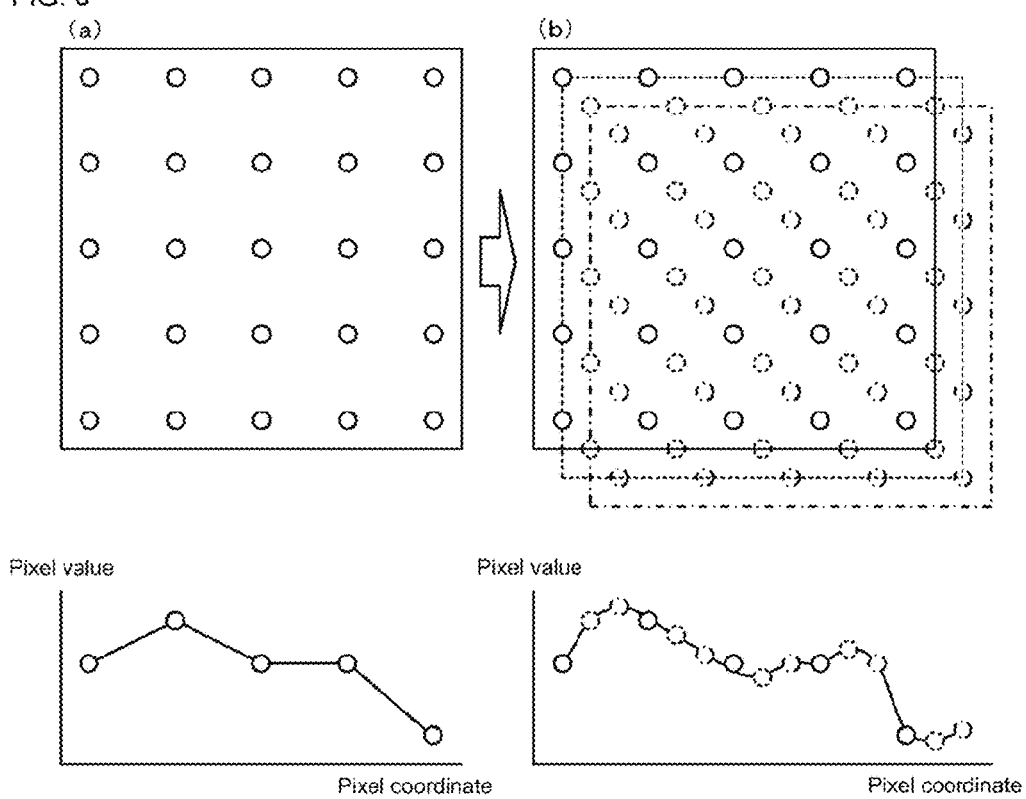
FIG. 8 describes high resolution processing.

Continuing, CPU 41, based on the position of reference mark 25, using the first image and the second image, performs high resolution processing to generate an image of component 60 picked up by mounting head 22 (step S250). With the high resolution processing, using the first image and the second image captured by imaging unit 30 at a first resolution, an image is generated that has a second resolution that is higher than the first resolution. With this high resolution processing, for example, processing such as motion estimation processing or registration is performed such that, using multiple images, the position of a target object (component 60) that accurately overlaps is determined using the position of reference mark 25 as a reference, a provisional high resolution image is generated, blur estimation processing and reconstruction processing is performed on the provisional image, and a high resolution image is generated compared to the captured images. This high resolution processing may be performed by image processing section 34. FIG. 8 illustrates high resolution processing; FIG. 8(a) is a schematic view of a low resolution image; FIG. 8(b) is a schematic view of a high resolution image obtained by overlapping low resolution images. FIG. 9 illustrates generation of high resolution images 73a and 73b; FIG. 9(a) is an image of high resolution image 73a of bump 61 generated from first image 71a and second image 72a; FIG. 9(b) is an image of high resolution image 73b of a chip component generated from first image 71b and second image 72b. As shown in FIG. 8(b), by overlapping low resolution images captured by being shifted within a range smaller than one pixel, it is possible to increase the information from between pixels. Also, because actual captured images are used, compared to interpolating information from between pixels by only estimating, it is possible to generate a highly reliable high resolution image. As shown in FIG. 9, with mounting device 11, it is possible to generate a high resolution image using images with a relatively low resolution. With mounting device 11, it is possible to capture images of components from relatively small chip components to relatively large components. Conventionally, to enable imaging unit 30 to capture high resolution images, the imaging range (field of view) needs to be smaller, meaning that images of large components cannot be captured, but if the imaging range is set to enable images of large component to be captured, the resolution is not sufficient for small components. With mounting device 11, it is possible to maintain a sufficient imaging range to capture images of large components, and, by performing high resolution processing, it is possible to maintain a sufficient resolution for capturing images of small components and small features.

After step S250, or after step S150, CPU 41, using an image based on image capturing, calculates the pickup position deviation amount of the component picked up by mounting head 22, and determines whether there is a shape error with the component (step S260). As the image based on image capturing, after step S250, this processing uses the high resolution image generated, and after step S150 this processing uses the image captured in step S150. The pickup position deviation amount, for example, can be determined based on the positional relationship of the center coordinates of suction nozzle 24 and reference mark 25, as the difference in the coordinate values in the X axis and the Y axis between the center position of component 60 and the center position of suction nozzle 24. Determining the component shape may be performed, for example, by matching the image based on image capture with a reference image, for example, performing matching based on a degree of matching for damage or deformation of bumps 61. Continuing, CPU 41, determines whether the position deviation amount and component shape are within an allowed range (step S270). The allowed range may be, for example, a range of a position deviation amount for which the component can be correctly arranged on board S, or a range set based on experience that defines a shape range for which the component does not lose its characteristics. When the pickup position deviation amount or component shape of the component picked up by mounting head 22 are within the allowed range, CPU 41 performs processing to mount (arrange) the component at a position corrected for the calculated pickup position deviation amount (step S280). On the other hand, if the pickup position deviation amount or component shape of the component picked up by mounting head 22 are not within the allowed range, CPU 41 performs discard processing that treats the component 60 as a component with a defect (step S290).

After step S280 or step S290, CPU 41 determines whether mounting processing by mounting device 11 on the current board S is complete (step S300), and if mounting processing on the current board S is not complete, performs processing from step S120 again. That is, CPU 41 sets the next component to be picked up, picks up that component, and then uses imaging unit 30 to capture a first image and a second image as necessary, performs high resolution processing, and determines the pickup position deviation and shape of the component. On the other hand, if mounting processing on the current board S is determined to be complete in step S300, CPU 41 unloads the board S for which mounting is complete (step S310), and determines whether production is complete (step S320). If production is not complete, CPU 41 performs processing from step S110. That is, CPU 41 loads and fixes a new board S and performs processing from step S120. On the other hand, if production is determined to be complete in step S320, CPU 41 ends the routine.

Correspondences between constituent elements of the present embodiment and constituent elements of the invention will be clarified here. Suction nozzle 24 of the present embodiment corresponds to a pickup member of the present invention, mounting head 22 corresponds to a mounting head, imaging unit 30 corresponds to an imaging unit, control device 40 corresponds to a control device, and reference mark 25 corresponds to a reference mark. Note that, with the present embodiment, an example of an imaging unit of the present invention is made clear from descriptions of imaging unit 30, and an example of an image processing method of the present invention is made clear from descriptions of operation of mounting device 11.

Mounting device 11 of an embodiment described above, at a first position at which mounting head 22 is stopped, captures an image of reference mark 25 under first imaging conditions, and captures an image of component 60 under second imaging conditions. Then, mounting device 11 moves mounting head 22 and captures an image of reference mark 25 at a second position at which mounting head 22 is stopped under the first imaging conditions, and captures a second image of component 60 under the second imaging conditions. Further, mounting device 11 generates a high resolution image of component 60 picked up by mounting head 22 based on the positional relationship of reference mark 25 using the first image and the second image. With mounting device 11, even if optimal imaging conditions are different for reference mark 25 and component 60, by capturing images under appropriate respective conditions, it is possible to achieve a better first image and second image. Also, with mounting device 11, it is possible to obtain a relative position of component 60 from the respective images of reference mark 25, and it is possible to generate a higher resolution image using the multiple images. Thus, with mounting device 11, it is possible to more reliably achieve a higher quality image.

Also, with this mounting device 11, by changing either of a lighting position of illumination, a color of illumination, an exposure time, or a focal length of lighting section 31 for reference mark 25 and component 60, it is possible to obtain a better image of each. Further, in a case in which control device 40 captures an image of component 60 after capturing an image of reference mark 25 at the first position and the second position, because reference mark 25 is imaged first as a reference position, it is easier and faster to perform image processing such as positional identification of the component or the like. On the other hand, in a case in which control device 40 captures an image of component 60 at the first position under the second imaging conditions and then moves mounting head 22 and captures an image of component 60 first at the second position under the second imaging conditions, because imaging is performed under the same imaging conditions before and after movement of mounting head 22, in a case in which time is required for processing to change the imaging conditions, because the frequency of changing the imaging conditions can be curtailed, the time required for processing overall can be reduced. Further, because control device 40 performs multiframe high resolution processing using a first image and a second image of a first resolution captured by imaging unit 30 to generate an image that has a second resolution that is higher than the first resolution, it is possible to more accurately determine the position and shape of the component. And, control device 40, when it is possible to capture an image of reference mark 25 and an image of the component picked up by mounting head 22 under the same imaging conditions, images reference mark 25 and the component together under the same imaging conditions. With mounting device 11, for a component for which the imaging conditions do not have to be changed for reference mark 25 and the component to obtain appropriate images, by capturing an image of reference mark 25 and the component under the same imaging conditions, the time required for processing can be reduced. Further, mounting device 11, when high resolution is required, is able to achieve a high resolution image by performing multiframe high resolution processing, meaning that the configuration is simpler than, for example, a configuration with multiple imaging sections 31 such as a high resolution imaging section and wide range imaging section.

Meanwhile, it goes without saying that the invention is not limited to the above-mentioned embodiment and various embodiments may be applied within the technical scope of the invention.

For example, in an embodiment above, mounting head 22 includes one reference mark 25, but the configuration is not limited to this. For example, multiple reference marks may be arranged in accordance with the component. In this case too, for components that cannot be handled by multiple reference marks, as above, multiple images can be captured under multiple imaging conditions, and a higher resolution image can be generated.

With an embodiment above, imaging conditions include a lighting position of illumination, a color of illumination, an exposure time, or a focal length, but the imaging conditions are not limited to these, one or more of these may be omitted, or other imaging conditions may be included.

With an embodiment above, after capturing an image at the first position under the second imaging conditions, mounting head 22 is moved, and then an image is captured first at the second position under the first imaging conditions, or, after capturing an image at the first position under the second imaging conditions, mounting head 22 is moved, and then an image is captured first at the second position under the second imaging conditions, but the configuration is not limited to this. For example, CPU 41 may capture an image at the first position under the first imaging conditions and then move mounting head 22 and capture an image first at the second position under the first imaging conditions. That is, so long as images of reference mark 25 and component 60 are captured at the same position, the order in which images are captured does not matter. However, from an image processing point of view, it is desirable to capture an image of reference mark 25 first at each position.

In an embodiment above, descriptions are given in which the component of which multiple images are captured under multiple conditions is component 60 (BGA component) with an array of bumps 61, but the component is not limited to this. The component of which multiple images are captured under multiple conditions may be, for example, a component with a small body, a component that is not particularly small but that has relatively small features, or any other component for which the appropriate imaging conditions differ with respect to reference mark 25.

In an embodiment above, all the suction nozzles 24 of mounting head 22 pick up a component 60 and images are captured under two different imaging conditions, first imaging conditions and second imaging conditions, but the configuration is not limited to this. For example, if multiple types of components for which multiple images are to be captured under multiple imaging conditions are to be picked up, CPU 41 may capture images at the same position under three or more imaging conditions, such as third imaging conditions and fourth imaging conditions, in accordance with the component. With this mounting device too, because appropriate images in accordance with the components are obtained, it is possible to more reliably achieve a higher quality image.

In an embodiment above, images are captured of reference mark 25 and component 60 at two positions, a first position and a second position, and a first image and a second image are obtained, but the configuration is not limited to this. For example, images may be captured of reference mark 25 and component 60 at three or more positions, such as a third position and a fourth position, and a third image and a fourth image may be obtained. With this mounting device, because an image with a second resolution that is a high resolution can be obtained using three or more images, it is possible to obtain an even higher quality image even more reliably than with mounting device 11. In an embodiment above, high resolution processing is performed by capturing two images, but so long as multiple images are used, the configuration is not particularly limited, and high resolution processing may be performed using three or more images.

In an embodiment above, in a case in which an image of reference mark 25 and an image of the component can be captured under the same imaging conditions, an image of both can be captured together without changing the imaging conditions (steps S140, S150), but this processing may be omitted. For example, steps S140 and S150 may be omitted in cases such as when mounting device is mounting only components such as component 60 for which multiple images are captured under multiple conditions.

In an embodiment above, a pickup member is described as suction nozzle 24, but so long as the pickup member can pick up a component, the configuration is not particularly limited, for example, a mechanical chuck that picks up a component by clamping the component mechanically.

In an embodiment above, the present invention is described as mounting device 11, but the present invention may be described as imaging unit 30, an imaging processing method, a control method of imaging unit 30, or a program run by a computer to perform the above processing.

INDUSTRIAL APPLICABILITY

The present invention may be used on a device that performs mounting processing of arranging components on a board.

REFERENCE SIGNS LIST

10: mounting system; 11: mounting device; 12: board conveyance unit; 13: mounting unit; 14: component supply unit; 20: head moving section; 22: mounting head; 23: Z-axis motor; 24, 24a to 24d: suction nozzle; 25: reference mark; 30: imaging unit; 31: illumination section; 32: lighting control section; 33: imaging element; 34: image processing section; 40: control device; 41: CPU; 42: ROM; 43: HDD; 44: RAM; 45: input-output interface; 46: bus; 50: management computer; 52: input device; 54: display; 60, 60B: component; 61: bump; 71 to 74: image; 71a, 71b: first image; 72a, 72b: second image; 73a, 73b: high resolution image; S: board

The invention claimed is:

1. A mounting device comprising:
a mounting head including a reference mark and a pickup member for picking up a component, the mounting head being configured to move a picked up component above a board;
an imaging section configured to capture an image; and
a control section configured to capture an image of the reference mark under first imaging conditions at a first position at which the mounting head is stopped within an imaging range of the imaging section, capture a first image that includes the component picked up by the pickup member under second imaging conditions that are different from the first imaging conditions, and then move the mounting head and capture an image of the reference mark under the first imaging conditions at a second position at which the mounting head is stopped within the imaging range, capture a second image that includes the component picked up by the pickup member under the second imaging conditions, and generate an image of the component picked up by the mounting head based on a positional relationship of the reference mark using the first image and the second image.

2. The mounting device according to claim 1, wherein the imaging conditions are at least one of a lighting position of illumination, a color of illumination, an exposure time, or a focal length.

3. The mounting device according to claim 1 or 2, wherein the control section is configured to, at the first position and the second position, image the reference mark and then image the component.

4. The mounting device according to claim 1 or 2, wherein the control section is configured to, after imaging at the first position under the first imaging conditions, move the mounting head and capture an image under the first imaging conditions at the second position first, or, after imaging at the first position under the second imaging conditions, move the mounting head and capture an image at the under the second imaging conditions at the second position first.

5. The mounting device according to claim 1 to 4, wherein the control section is configured to, using the first image and the second image having a first resolution captured by the imaging section, generate an image of a second resolution that has a higher resolution than the first resolution.

6. The mounting device according to claim 1 to 5, wherein the control section is configured to, when it is possible to capture the reference mark and the component under the same conditions, image the reference mark and the component together under the same imaging conditions.

7. An image processing method for a mounting device provided with a mounting head including a reference mark and a pickup member for picking up a component, the mounting head being configured to move a picked up component above a board, and an imaging section for capturing images, the image processing method comprising:
capturing an image of the reference mark under first imaging conditions at a first position at which the mounting head is stopped within an imaging range of the imaging section, capturing a first image that includes the component picked up by the pickup member under second imaging conditions that are different from the first imaging conditions, and then moving the mounting head and capturing an image of the reference mark under the first imaging conditions at a second position at which the mounting head is stopped within the imaging range, capturing a second image that includes the component picked up by the pickup member under the second imaging conditions, and generating an image of the component picked up by the mounting head based on a positional relationship of the reference mark using the first image and the second image.

8. An imaging unit for a mounting device provided with a mounting head including a reference mark and a pickup member for picking up a component, the mounting head being configured to move a picked up component above a board, and an imaging section for capturing images, the imaging unit comprising:
an imaging section configured to capture an image; and
a control section configured to capture an image of the reference mark under first imaging conditions at a first position at which the mounting head is stopped within an imaging range of the imaging section, capture a first image that includes the component picked up by the pickup member under second imaging conditions that are different from the first imaging conditions, and then move the mounting head and capturing an image of the reference mark under the first imaging conditions at a second position at which the mounting head is stopped within the imaging range, capture a second image that includes the component picked up by the pickup member under the second imaging conditions, and generate an image of the component picked up by the mounting head based on a positional relationship of the reference mark using the first image and the second image.

* * * * *